United States Patent
Tanaka et al.

(10) Patent No.: US 10,017,203 B2
(45) Date of Patent: Jul. 10, 2018

(54) INTEGRAL-TYPE ELECTRIC POWER STEERING DEVICE

(75) Inventors: Daisuke Tanaka, Chiyoda-ku (JP); Yoshihito Asao, Chiyoda-ku (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 494 days.

(21) Appl. No.: 14/351,967

(22) PCT Filed: May 28, 2012

(86) PCT No.: PCT/JP2012/063598
§ 371 (c)(1),
(2), (4) Date: Apr. 15, 2014

(87) PCT Pub. No.: WO2013/108422
PCT Pub. Date: Jul. 25, 2013

(65) Prior Publication Data
US 2014/0239780 A1    Aug. 28, 2014

(30) Foreign Application Priority Data
Jan. 17, 2012  (JP) ................. 2012-006764

(51) Int. Cl.
| H02K 11/00 | (2016.01) |
| B62D 5/04 | (2006.01) |
| H05K 7/20 | (2006.01) |
| H02K 11/225 | (2016.01) |
| H02K 11/33 | (2016.01) |
| H02K 7/116 | (2006.01) |

(52) U.S. Cl.
CPC ......... B62D 5/0409 (2013.01); B62D 5/0406 (2013.01); H02K 11/225 (2016.01);
(Continued)

(58) Field of Classification Search
CPC .. H02K 7/1163; H02K 7/1166; H02K 11/225; H02K 11/33; B62D 5/0409; B62D 5/0406; H01L 2924/0002
(Continued)

(56) References Cited

U.S. PATENT DOCUMENTS

| 5,844,386 A | 12/1998 | Matsuoka et al. |
| 6,268,669 B1 * | 7/2001 | Wakao ................. B62D 5/0406 |
| | | 180/443 |

(Continued)

FOREIGN PATENT DOCUMENTS

| CN | 101980914 A | 2/2011 |
| DE | 4410061 A1 | 9/1994 |

(Continued)

OTHER PUBLICATIONS

Communication dated Jul. 29, 2015 from the State Intellectual Property Office of the People's Republic of China in counterpart application No. 201280055684.4.

(Continued)

*Primary Examiner* — Burton Mullins
(74) *Attorney, Agent, or Firm* — Sughrue Mion, PLLC; Richard C. Turner

(57) ABSTRACT

An integral-type electric power steering device is configured in such a way that a motor component, a reduction mechanism, and a control device are integrally fixed, and the control device includes at least heating elements which are operated for control and which generate heat, a control board on which the heating elements are mounted, and mechanism components for fixing the control board; and at least a part of the heat, which is generated by the heating elements, is conducted to the mechanism components via a thermal-conductive component.

23 Claims, 5 Drawing Sheets

(52) U.S. Cl.
CPC .......... *H02K 11/33* (2016.01); *H05K 7/2039* (2013.01); *H01L 2924/0002* (2013.01); *H02K 7/1166* (2013.01)

(58) Field of Classification Search
USPC ................ 180/443–444; 361/704, 718–719; 310/83, 64, 68 D
See application file for complete search history.

(56) References Cited

U.S. PATENT DOCUMENTS

| | | | |
|---|---|---|---|
| 6,761,813 B2* | 7/2004 | Xu | .......................... F28F 13/00 205/114 |
| 7,663,273 B2* | 2/2010 | Shiino | .................... B60T 8/267 310/59 |
| 2005/0063836 A1* | 3/2005 | Kimura | ................. F04B 39/121 417/313 |
| 2007/0144822 A1 | 6/2007 | Tominaga et al. | |
| 2008/0278918 A1 | 11/2008 | Tominaga et al. | |
| 2010/0288577 A1 | 11/2010 | Sonoda et al. | |
| 2011/0066332 A1 | 3/2011 | Sonoda et al. | |
| 2014/0151146 A1 | 6/2014 | Tanaka et al. | |

FOREIGN PATENT DOCUMENTS

| | | |
|---|---|---|
| DE | 102007014645 A1 | 10/2008 |
| DE | 102007056750 A1 | 11/2008 |
| EP | 0753448 A1 | 1/1997 |
| EP | 2048060 A2 | 4/2009 |
| EP | 2261099 A1 | 12/2010 |
| FR | 2893579 A1 | 5/2007 |
| JP | 2002-345211 A | 11/2002 |
| JP | 2002345211 A | 11/2002 |
| JP | 2007-062433 A | 3/2007 |
| JP | 2007-288929 A | 11/2007 |
| JP | 2007-288989 A | 11/2007 |
| JP | 2007288929 A | 11/2007 |
| JP | 2009-274489 A | 11/2009 |
| JP | 2011-217546 A | 10/2011 |
| JP | 2011-228379 A | 11/2011 |
| WO | 2009/125506 A1 | 10/2009 |
| WO | 2010/007672 A1 | 1/2010 |
| WO | 2012137333 A1 | 10/2012 |

OTHER PUBLICATIONS

Communication dated Mar. 18, 2016, from the European Patent Office in counterpart European Application No. 12866198.0.
International Search Report of PCT/JP2012/063598 dated Sep. 11, 2012.
Communication dated Mar. 15, 2016 from the State Intellectual Property Office of the P.R.C. in counterpart Application No. 201280055684.4.
Communication dated Jul. 4, 2017, from the European Patent Office in counterpart European Application No. 12866198.0.
Communication dated Feb. 6, 2018, from the European Patent Office in counterpart European Application No. 12866198.3.

* cited by examiner

INTEGRAL-TYPE ELECTRIC POWER STEERING DEVICE

CROSS REFERENCE TO RELATED APPLICATIONS

This is a National Stage of International Application No. PCT/JP2012/063598 filed May 28, 2012, claiming priority based on Japanese Patent Application No. 2012-006764 filed Jan. 17, 2012, the contents of all of which are incorporated herein by reference in their entirety.

BACKGROUND OF THE INVENTION

Technical Field

The present invention relates to an integral-type electric power steering device mounted on a car.

Background Art

A conventional integral-type electric power steering device is configured in such a way that heating elements of power component composing an inverter and an electron relay are directly mounted on a board made from a metal or a ceramic, and adhered so as to be fixed, by a screw or a spring mechanism, to a mechanic component such as a heat sink, whereby heat generated by the heating elements is radiated to the mechanic component (for example, refer to Patent Document 1).

CONVENTIONAL ART DOCUMENT

Patent Document

[Patent Document 1]
International Publication No. WO/2010/007672A1

SUMMARY OF THE INVENTION

Problems to be Solved by the Invention

In a conventional integral-type electric power steering device, there has been a problem in that heat-radiation countermeasures are not sufficient to the heating elements mounted on a board in a state where the heating elements are not contacted to mechanism components. Moreover, although there is another case in which a special heat sink and a fan are mounted on the board and the heating elements, here have been problems in that a weight of the device is increased in this case, and sufficient strengths of solder for fixing elements and solder on the board are not obtained.

The present invention has been made to solve the above-described problems of the conventional integral-type electric power steering device, and an object of the invention is to provide an integral-type electric power steering device in which a simplified configuration and an improvement of an assembling capability are realized, and a radiation capability of the heating elements is improved, and moreover, high endurance and reliability are realized.

Means for Solving Problems

An integral-type electric power steering device of the present invention includes a motor component including a motor that generates an assist torque corresponding to a steering torque caused by a driver in a car and applies the generated assist torque to a steering shaft of the car via a reduction mechanism; and a control device including control-circuit elements for controlling the motor in a state where the motor component, the reduction mechanism, and the control device are integrally fixed; wherein the control device includes at least heating elements having the control-circuit elements, which are operated so as to generate heat, a control board on which the heating elements are mounted, and a mechanism components for fixing the control board; and at least a part of the heat, which is generated by the heating elements, is conducted to the mechanism components via a thermal-conductive component.

Effects of the Invention

According to the integral-type electric power steering device of the present invention, the heat, which is generated by the heating elements, can be effectively radiated to the mechanism components via the thermal-conductive component, so that the integral-type electric power steering device having high endurance and reliability can be obtained.

DETAILED DESCRIPTION OF THE PREFERRED EMBODIMENTS

Embodiment 1

Figure 1:
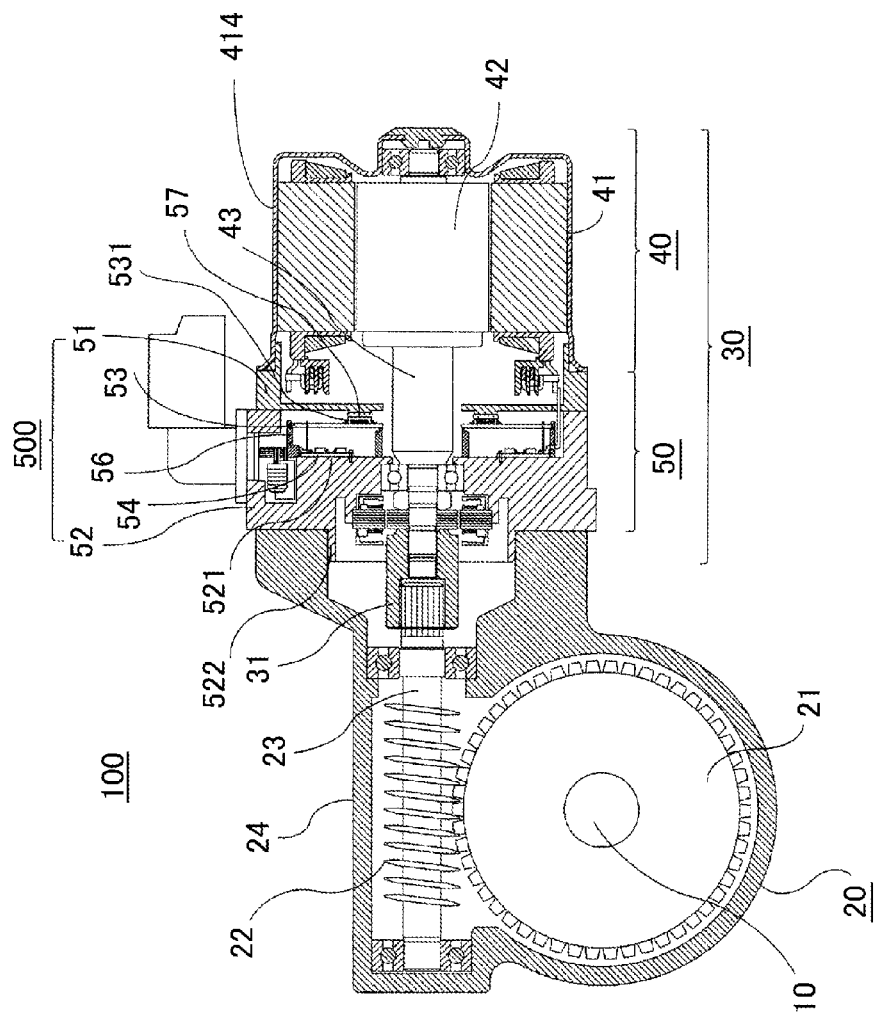
FIG. 1 is a cross-sectional view illustrating an integral-type electric power steering device according to Embodiment 1 of the present invention.
Figure 2:
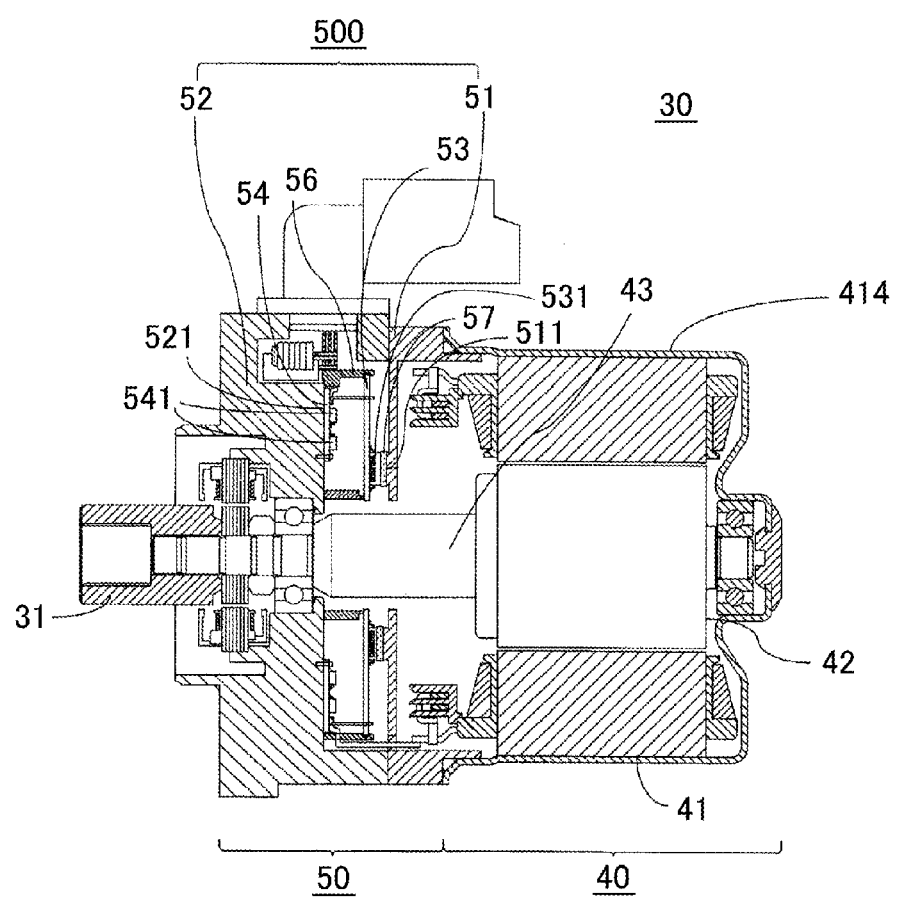
FIG. 2 is a cross-sectional view illustrating a control-device-integrated motor in the integral-type electric power steering device according to Embodiment 1 of the present invention.

FIG. 1 is a cross-sectional view illustrating an integral-type electric power steering device according to Embodiment 1 of the present invention, and FIG. 2 is a control-device-integrated motor in the integral-type electric power steering device according to Embodiment 1 of the present invention. In the integral-type electric power steering device according to Embodiment 1 of the present invention, which is explained below, the control-device-integrated motor (referred to as MCU) is configured as a permanent-magnet-type synchronous motor.

In FIG. 1 and FIG. 2, a control-device-integrated motor 30 is integrally connected to a steering shaft 10, which is connected to a handle (not illustrated) operated by a driver, via a reduction mechanism 20 (including gears as described below) in an integral-type electric power steering device 100. By the control-device-integrated motor 30 assist torque is applied to the steering shaft 10 via the reduction mechanism 20 when the handle is operated by the driver, and handle-operation power of the driver is reduced.

The reduction mechanism 20 includes a warm wheel 21, which is fixed to the steering shaft 10, a warm gear 22 having a warm gear shaft 23, which is engaged to the warm wheel 21, and a housing 24. The warm gear shaft 23 is spliced to a rotor shaft 43 of the control-device-integrated motor 30 by a boss 31, used as a coupling component, which is connected to an end portion of a rotor shaft 43 of the control-device-integrated motor.

The control-device-integrated motor 30 includes a motor component 40 (referred to as a motor) having a stator 41 and a rotor 42, and a control device 50 having a motor driving circuit. The control device 50 includes a motor-side case 51 and a reduction-mechanism-side case 52, which are used as metal cases. The stator 41 is fixed to an inside surface of a cylinder-shaped frame 414 made from iron.

The frame 414 is fixed to the motor-side case 51 a screw (not illustrated). The motor-side case 51 is composed of a die-cast component made from an aluminum alloy, and the end portion in an axis direction of the motor-side case 51 is connected to an end portion in the axis direction of the reduction-mechanism-side case 52.

The reduction-mechanism-side case 52 is composed of a die-cast component made from an aluminum alloy, and the case 52 includes an inner wall 521 which is extended in a direction perpendicular to the axis direction of the reduction-mechanism-side case 52. The reduction-mechanism-side case 52 and the housing 24 of the reduction mechanism 20 are integrally connected by a bolt (not illustrated) in such a way that an inside-low portion 522, which is formed at an end portion in an axis direction of the reduction-mechanism-side case 52, is fitted to an inner surface of the housing 24 of the reduction mechanism 20.

The control device 50 has inner space of the control device, which is linked to inner space of the motor component 40. Moreover, in the inner space of the control device, the control device 50 includes a control board 53 made from a glass-epoxy resin, on which heating elements 531, such as a microcomputer and a FET-driving circuit, and the other elements (not illustrated), which are required for control, are mounted; and a power board 54 on which a power semiconductor element 541 composed of a power MOSFET, a shunt resistance (not illustrated), and the other elements (not illustrated), which are required for a power circuit, are mounted. In addition, the power circuit generates the highest heat in the control device 50.

The power board 54 is fitted and connected to a motor-side wall, surface of the inner wall 521 of the reduction-mechanism-side case 52. In addition, the power board 54 may be fitted and connected to a reduction-mechanism-side wall surface of the inner wall 521 of the reduction-mechanism-side case 52, or to the motor-side case 51.

The control board 53 includes a power-signal terminal and a signal terminal, and the control board 53 is fixed on a terminal mold 56. The terminal mold 56 is fixed, in the control device 50, to the reduction-mechanism-side case 52. The control board 53, an outside power cable, a signal terminal, and the power board 54 are electrically connected by solder or a snap fit.

As described above, the integral-type electric power steering device, which is configured in such a way that, the reduction mechanism 20 and the control-device-integrated motor (MCU) 30, which is composed of the motor component 40 and the control device 50, include a common rotational shaft, is specially defined as a coaxial-integral-type electric power steering device in this description.

When the control device 50 is operated, the microcomputer and the FET-driving circuit, which are mounted on the control board 53, consistently generate heat. The above-described elements, which are mounted on the control board 53 and generate heat, are referred to as the heating elements 531. An appropriate radiation means for preventing the heating elements 531 from a crash, a runaway, and a reduction of reliability, which are caused by heat, is required for the heating elements 531.

The motor-side case 51 and the reduction-mechanism-side case 52 of the control device 50 have functions of conducting and radiating heat generated in the control device 50, so that the case are called as mechanism components 500 when the case are compared with the heating elements 531 on the heat conducting function and the heat radiating function. Moreover, the mechanism components 500 may be composed of components which have a thermal conductance and are arranged near the heating elements 531, and may be configured as components of the control device 50, parts of the reduction mechanism 20, or parts of the motor component 40.

The heating elements 531 are mounted on the control board 53, and neighboring areas of the heating elements 531 are not directly contacted to the mechanism components 500, so that, in a case of a conventional device, heat generated from the heating elements 531 is conducted from surfaces of the heating elements 531 or from the control board 53, to which the heat is previously conducted, to air in the control device 50 and then, the heat is conducted from the air to the mechanism components 500 so as to be radiated. However, a thermal resistance of air is very high, so that a radiation effect of the heating elements 531 on the control board 53 has been low.

In conventional devices, there have been cases in which a special heat sink or a fan is provided for the heating elements 531. However, there have been problems in that a complex configuration is required, and a number of components is increased, and a pressing process by a screw, a spring structure or the like is required, so that a weight of the device is increased, and strengths of elements, solder for the elements, boards, and solder for the boards are required.

The integral-type electric power steering device according to Embodiment 1 of the present invention has a configuration in which a thermal-conductive component 57 having a thermal conductance is arranged in space between the heating elements 531 and the power semiconductor element 541, whereby a thermal-conductive passage, by which heat is radiated from the heating elements 531, via the thermal-conductive component 57, to the mechanism components 500, is configured, so that the radiation capability can be enhanced, and a simple structure for radiating the heat can be configured. Almost all surfaces of the thermal-conductive component 57 are contacted to the surfaces of the heating elements 531, and heat generated from the heating elements 531 is effectively conducted to the thermal-conductive component 57.

In addition, as described above in Embodiment 1, the integral-type electric power steering device is configured in such a way that almost all surfaces of the thermal-conductive component 57 are contacted to the surfaces of the heating elements 531. However, when the thermal conductive component 57 is positioned at not only near the heating elements 531 but also near, for example, the control board 53, it is possible that heat of the whole control board 53 is radiated, by using a thermal-conductive function of the control board 53, to the mechanism components 500 via a radiation component.

Moreover, the thermal-conductive component 57 having flexibility, elasticity, and adhesiveness, which is disposed between the control board 53 and the mechanism components 500, is configured in such a way that the thermal-conductive component 57 functions as a cushion between the control board 53 and the mechanism components 500 when a vibration is applied to the integral-type electric power steering device 100, whereby the thermal-conductive component 57 is contacted to the heating elements 531 and the mechanism components 500, without having a gap, so as to conduct the heat, and can suppress a displacement caused by vibration of the control board 53.

In the assembling process of the control device 50, the reduction-mechanism-side case 52, the power board 54, a terminal mold 56, the control board 53, and the motor-side case 51 are sequentially assembled from a left side in FIG. 1 in an axis direction. At this time, the reduction-mechanism-side case 52 and the motor-side case 51 of the mechanism components 500 are arranged in such a way that the control board 53, on which the heating elements 531 are mounted, and the mechanism components 500 are vertically faced in the axis direction, and the thermal-conductive component 57 is arranged in such a way that the thermal-conductive component 57 is faced to a neighboring portion of the heating elements 531 which is mounted on the control board 53. In addition, the thermal-conductive component 57 may be adhered on the surfaces of the heating elements 531.

As described above, the integral-type electric power steering device according to Embodiment 1 of the present invention is configured in such a way that the thermal-conductive component 57 can be easily sandwiched, in the above-described assembling process, between the heating elements 531 and the motor-side case 51 of the mechanism components 500.

In order to obtain a great radiation effect by radiating heat from the heating elements 531 to the mechanism components 500 of the motor component 40 having a large heat mass, the thermal-conductive component 57 is arranged in such a way that the surfaces, at the motor component 40 side, of the heating elements 531 is faced to the motor-side case 51.

Moreover, the power board 54 mounting the elements and the circuit, which generate the greatest amount of heat, is contacted and fixed to the reduction-mechanism-side case 52 of the control device 50. Thereby, the heat generated by the power board 54 is radiated to the reduction mechanism (gear) 20 side via the reduction-mechanism-side case 52. Furthermore, as described above, the heat generated by the heating elements 531, which is mounted on the control board 53, is radiated to the motor component 40 side via the thermal-conductive component 57 and the motor-side case 51. As a result, the heat generated by the power board 54 and the heat generated by the heating elements 531 mounted on the control board 53 are radiated in a state where those are not interfering with each other, whereby the radiation effect is improved.

The motor-side case 51 of mechanism components 500 has a convex portion 511 near a contact portion for the thermal-conductive component 57, and a thickness of the convex portion 511 is regulated, whereby a distance between a surface of the convex portion 511 and the surfaces of the heating elements 531, in other words, a thickness of the thermal-conductive component 57 can be regulated.

Moreover, a thermal capacity of the mechanism components 500 is enhanced by the convex portion 511. The mechanism components 500 is made from a material, such as a metal, of which thermal conductance is high, and the thermal conductance of the mechanism components 500 is higher than a thermal conductance of a material of a component used as the thermal-conductive component 57. Therefore, the integral-type electric power steering device is configured in such a way that the convex portion 511 is provided on the mechanism components 500, whereby the distance between the surface of the convex portion 511 and the surfaces of the heating elements 531, in other words, the thickness of the thermal-conductive component 57 is reduced so as to improve a radiation effect, and the amount of usage of the thermal-conductive component 57 is decreased so as decrease the cost of the device. Furthermore, the integral-type electric power steering device is configured in such a way that a thermal capacity of the mechanism components 500 composing a thermal conductive passage is enhanced, whereby a temperature rise of the heating elements 531 is suppressed.

When the mechanism components 500 is attached, the heating elements 531 and the control board 53, on which the elements are mounted, are pressed by the mechanism components 500 via the thermal-conductive component 57, so that a stress is caused. The thermal-conductive component 57 has flexibility and rebound resilience, so that it is effective to reduce the stress that a thickness of the thermal-conductive component 57 is increased.

The convex portion 511 is provided near the contact portion for the thermal-conductive component 57 of the mechanism components 500, whereby the distance, in other words, the thickness of the thermal-conductive component by which the thermal conductance and the stress of the thermal-conductive component 57 corresponding to the heating elements 531 mounted on the control board 53 are also reduced, can be optimally set. Moreover, even when a plurality of heating elements 531, of which thicknesses different each other, are mounted on the control board 53, a plurality of convex portions 511, of which thicknesses are different each other, respectively corresponding to the heating elements 531 are provided on the control board 53, whereby the thermal-conductive component 57, which has the best thickness corresponding to all heating elements 531, can be arranged.

Moreover, a processing means, for example, a processing for reducing roughness of the surface, a coat processing, or a paint processing, by which a contact-thermal resistance is reduced, is treated on the convex portions 511, whereby air intervenes between the thermal-conductive component 57 and the mechanism components 500, so that it can be prevented that a cooling capacity is decreased, and the radiation effect can be improved.

In Embodiment 1 of the present invention, a curable resin is used for the thermal-conductive component 57, whereby an adhering process for the heating elements 531 of the thermal-conductive component 57 is rationalized by using an automatic adhering machine.

Moreover, the integral-type electric power steering device is configured in such a way that, after the curable resin used for the thermal-conductive component 57 is adhered to the heating elements 531 in the adhering process, the mechanism components 500 are assembled before the curable resin is stiffened, and the curable resin is stiffened in the next process, whereby it is prevented that the stress is caused when the mechanism components 500 are assembled and the components press the heating elements 531 and the control board 53 so as to be contacted, and the device becomes free toward the stress.

In addition, as described above in Embodiment 1, although the control device 50, the motor component 40, and the reduction mechanism 20 are coaxially formed, the control device 50 may be not coaxially formed, and the control device 50 may be arranged at, for example, an upper position or a lower position of the motor component 40 illustrated in FIG. 1. Even in this case, an effect, in which heat is radiated from the heating elements 531 mounted on the control board 53 to the mechanism components 500 via the thermal-conductive component 57, and an effect, in which a vibration displacement of the control board 53 is suppressed, can be obtained in a similar case where the control device 50 is coaxially formed.

In addition, as described above in Embodiment 1, the power board 54 and the control board 53 are separately formed, and the power board 54 is contacted to the mechanism components 500, whereas the control board 53 is not contacted to the mechanism components 500. However, the power board 54 may be not contacted to the mechanism components 500, and heat may be radiated to the mechanism components 500 via the thermal-conductive component 57. Moreover, it is possible that the power board 54 and the control board 53 are formed in one board, and the heat is radiated to the mechanism components 500 via the thermal-conductive component 57.

As described, above, in the integral-type electric power steering device according to Embodiment 1 of the present invention, the thermal-conductive component 57 intervenes between neighboring portions of the heating elements 531, which are mounted on the control board 53, and the mechanism components 500, so that the heat is conducted from the heating elements 531 to the mechanism components 500 via the thermal-conductive component 57 so as to suppress a temperature, and the thermal-conductive component 57 is operated as a vibration damper between the control board 53 and the mechanism components 500, whereby the vibration displacement of the control board 53 can be suppressed.

Moreover, in the integral-type electric power steering device according to Embodiment 1 of the present invention, the thermal-conductive component 57 is directly contacted to the heating elements 531, so that a thermal-conductive effect can be improved.

Moreover, in the integral-type electric power steering device according to Embodiment 1 of the present invention, the control device 50, the motor component 40, and the reduction mechanism 20 are coaxially formed, and the motor-side case 51 and the reduction-mechanism-side case 52 of the mechanism components 500 are arranged on a vertical surface with respect to the axis, and the thermal-conductive component 57 is arranged so as to face these components with respect to the surface of the control board 53. Therefore, in the process of sequentially assembling mechanism parts composing the control device 50, the power board 54, and the control board 53 from the axis direction, the thermal-conductive component 57 can be easily sandwiched between the heating elements 531 and the motor-side case 51.

Moreover, in the integral-type electric power steering device according to Embodiment 1 of the present invention, the reduction-mechanism-side case 52 of the control device 50 is arranged so as to face to the heating elements 531, and the heat generated by the heating elements 531 is radiated to the motor-side case 51 via the thermal-conductive component 57, so that the heat can be radiated to the motor component 40 having a large heat mass, and the radiation effect can be improved.

Moreover, in the integral-type electric power steering device according to Embodiment 1 of the present invention, the control device 50 is coaxially arranged between the reduction mechanism 20 and the motor component 40, so that the power board 54 is arranged at the reduction-mechanism-side case 52 in the control device 50, and the highest heat, which is generated by the power board, is radiated to the reduction mechanism 20, whereby the heat, which is generated by the heating elements 531 mounted on the control board 53, can be radiated to the motor component 40 via the thermal-conductive component 57, whereby the heat is effectively radiated without heat interference caused from the power board 54 and the control board 53, and the integral-type electric power steering device can be effectively cooled.

Moreover, in the integral-type electric power steering device according to Embodiment 1 of the present invention, the convex portion 511 is formed on a thermal conductive surface of the mechanism components 500, which is faced to the thermal-conductive component 57, so that gaps between the heating elements 531, the control board 53, and the mechanism components 500, in which the thermal-conductive component. 57 is sandwiched, can be regulated and set at an optimum distance in which a stress reduction and a cooling capacity are realized, and the thermal capacity of the mechanism components 500 is enhanced, whereby the temperature rise of the heating elements 531 can be suppressed.

Moreover, in the integral-type electric, power steering device according to Embodiment 1 of the present invention, the contact surface of the convex portion 511, which is contacted to the thermal-conductive component 57, has the above-described reduction means for reducing the contact-thermal resistance, so that it can be prevented that air intervenes between the thermal-conductive component 57 and the mechanism components 500 so as to degree the cooling capacity.

Moreover, in the integral-type electric power steering device according to Embodiment 1 of the present invention, the curable resin is used for the thermal-conductive component 57, whereby the adhering process for the heating elements 531 of the thermal-conductive component 57 can be rationalized.

Moreover, in the integral-type electric, power steering device according to Embodiment 1 of the present invention, the thermal-conductive component 57 are assembled before the curable resin is stiffened, and the curable resin is stiffened in the next process, whereby the device can become free toward the stress in a state where the stress is not caused on the board and the heating elements 531 when the mechanism components 500 are assembled.

Embodiment 2

In the above-described configuration of the integral-type electric power steering device according to Embodiment 1, the thermal-conductive component 57 is directly contacted to the surfaces of the heating elements 531, whereas in a configuration of an integral-type electric power steering device according to Embodiment 2, a thermal-conductive component 57 is contacted to an opposite installation surface being opposite to a surface on which heating elements 531 of a control board 53 are mounted.

Figure 3:
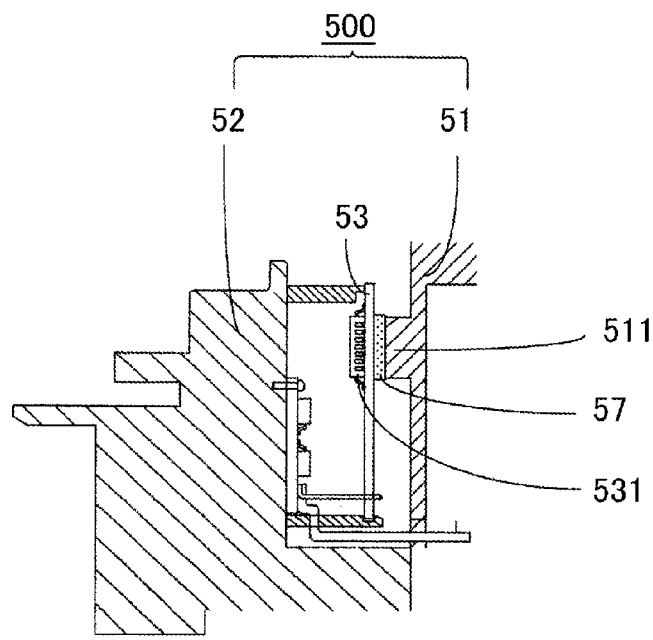
FIG. 3 is a partial cross-sectional view illustrating an integral-type electric power steering device according to Embodiment 2 of the present invention.

FIG. 3 is a partial cross-sectional view illustrating the integral-type electric power steering device according to Embodiment 2 of the present invention, and a coaxial-integral-type electric power steering device, in which a control device 50 is arranged between a reduction mechanism 20 and a motor component 40, is indicated. In FIG. 3, the control board 53 is fixed to a reduction-mechanism-side case 52. The heating elements 531 are mounted on a surface facing to the reduction-mechanism-side case 52 of the control board 53. The thermal-conductive component 57 is contacted to the opposite surface being opposite to the surface, on which the heating elements 531 of the control board. 53 are mounted, so as to be arranged. A surface of a convex portion 511, which is formed on a motor-side case 51, is contacted to a surface of the thermal-conductive component 57. The other configurations in Embodiment 2 are similar to the configurations in Embodiment 1.

The heat generated by the heating elements 531 is conducted to the thermal-conductive component 57 via the control board 53, and moreover, the heat conducted to the motor-side case 51 of mechanism components 500 via the thermal-conductive component 57. At this time, if the surface, on which the heating elements 531 of the control board 53 are mounted, is linked to the opposite mount surface by a conductive through hall, and a conductive pattern is formed at a portion to which the thermal-conductive component 57 is contacted, the heat can be more effectively radiated by using the conductive through hall and the conductive pattern.

Although there is a case in which distances between the heating elements 531 and the mechanism components 500 are varied in accordance with a thermal expansion/constriction of the mechanism components 500, which is caused by a temperature variation, when the mechanism components 500 and the heating elements 531 are contacted by the thermal-conductive component 57, a pulling/pressing stress is applied to the heating elements 531. Moreover, although lead wires of the heating elements 531 are usually mounted on the control board 53 by solder, when the temperature variation is repeated, the stress is repeatedly applied to the lead wires and the soldered portion. Therefore, as described above, the thermal-conductive component 57 is arranged at the surface of the control board 53, on which the heating elements 531 are not mounted, whereby the stress, which is applied to the lead wires and the soldered portion of the heating elements 531, can be deleted.

As described above, in the integral-type electric power steering device according to Embodiment 2 of the present invention, the thermal-conductive component 57 is arranged between the mechanism components 500 and the surface on which the heating elements 531 of the control board 53 are not mounted, so that the stress, which is caused by the thermal vibration and is applied to the lead wires and the soldered portion of the heating elements 531, can be deleted, whereby useful lives of the solder and the components can be increased, and the reliability of the device can be improved.

Moreover, in the integral-type electric power steering device according to Embodiment 2 of the present invention, a curable resin is used for the thermal-conductive component 57, whereby an adhering process of the thermal conductive component 57 can be rationalized.

Embodiment 3

Figure 4:
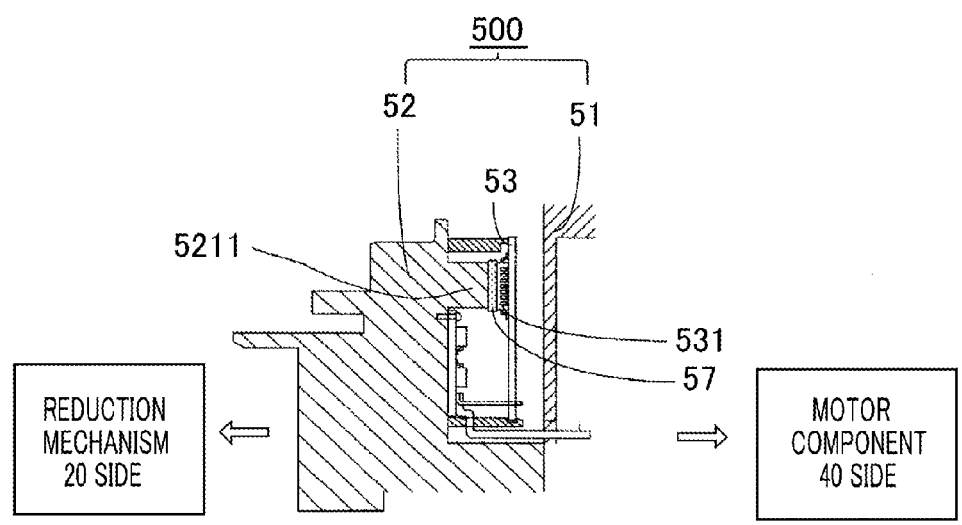
FIG. 4 is a partial cross-sectional view illustrating an integral-type electric power steering device according to Embodiment 3 of the present invention.

FIG. 4 is a partial cross-sectional view illustrating an integral-type electric power steering device according to Embodiment 3 of the present invention, and a coaxial-integral-type electric power steering device, in which a control device 50 is arranged between a reduction mechanism 20 and a motor component 40, is indicated. In FIG. 4, a control board 53 is fixed to a reduction-mechanism-side case 52. Heating elements 531 are mounted on a surface facing to the reduction-mechanism-side case 52 of the control board 53. A thermal-conductive component 57 is arranged between surfaces of heating elements 531 and a surface of a convex portion 5211 which is formed on the reduction-mechanism-side case 52.

As described above, in the integral-type electric power steering device according to Embodiment 3 of the present invention, heat generated by the heating elements 531 is radiated to the reduction-mechanism-side case 52 via the thermal-conductive component 57. The thermal-conductive component 57 is directly arranged between the reduction-mechanism-side case 52 and the heating elements 531 which are mounted on the surface facing to the reduction-mechanism-side case 52 of the control board 53, whereby the heat generated by the heating elements 531 can be conducted to the reduction mechanism 20 having a large heat mass so as to be radiated.

In addition, the heating elements 531 may be mounted on an opposite surface of the reduction-mechanism-side case 52 of the control board 53, and the thermal-conductive component 57 may be arranged on the surface facing to the reduction-mechanism-side case 52 of the control board 53, whereby the heat is radiated. The effect in this case is the same as the effect in Embodiment 2.

Moreover, in the integral-type electric power steering device according to Embodiment 3 of the present invention, the curable resin is used for the thermal-conductive component 57, whereby the adhering process for the heating elements 531 of the thermal-conductive component 57 can be rationalized.

As described above, in the integral-type electric power steering device according to Embodiment 3 of the present invention, the device is configured as a coaxial type in which the control device 50 is arranged between the reduction mechanism 20 and the motor component 40, and the heat generated by the heating elements 531 is radiated to the reduction-mechanism-side case 52 via the thermal-conductive component 57, so that the heat can be radiated to the reduction mechanism (gear) 20 having a large heat mass, and the radiation effect of the device can be improved.

Embodiment 4

Figure 5:
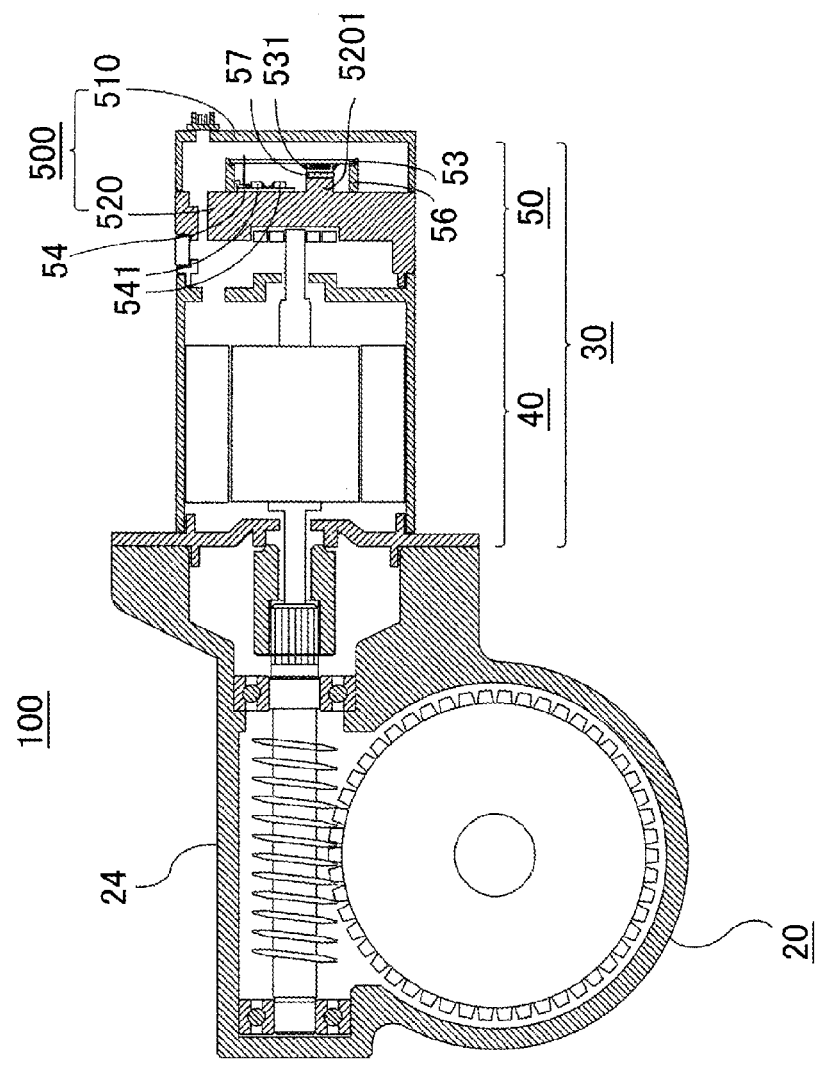
FIG. 5 is a cross-sectional view illustrating an integral-type electric power steering device according to Embodiment 4 of the present invention.

FIG. 5 is a cross-sectional view illustrating an integral-type electric power steering device according to Embodiment 4 of the present invention, and a coaxial-integral-type electric power steering device, in which a motor component 40 is arranged between a reduction mechanism 20 and a control device 50, is indicated. In other words, as illustrated in FIG. 5, the control device 50 is coaxially arranged with the motor component 40 at a side, being opposite to the reduction mechanism 20, of the motor component 40.

A control board 53 is fixed to a reduction-mechanism-side case 52 of the control device 50. Heating elements 531 are mounted on a surface of the control board 53, which is faced to the motor-side case 520. A thermal-conductive component 57 is arranged between surfaces of heating elements 531 and a surface of a convex portion 5201 which is formed on the motor-side case 520.

The device is configured in such a way that the generated by the heating elements 531 is radiated to the motor-side case 520 via the thermal-conductive component 57. The heat generated by the heating elements 531 is radiated to the motor component 40 having a large heat mass, which conducts the heat generated by itself to the reduction mechanism (gear) 20, whereby a radiation effect of the heating elements 531 can be improved.

In addition, the heating elements 531 may be mounted on a surface facing to a motor-opposite-side case 510 of the control board 53, and the thermal-conductive component 57 may be arranged between a surface facing the motor-side case 520 of the control board 53 and a surface of the convex portion 5201 formed on the motor-side case 520, whereby the heat generated by the heating elements 531 may be radiated to the motor-side case 520 via the control board 53 and the thermal-conductive component 57. The effect in this case is the same as the effect in Embodiment 2.

Moreover, in the integral-type electric power steering device according to Embodiment 4 of the present invention, the curable resin is used for the thermal-conductive component 57, whereby the adhering process for the heating elements 531 of the thermal-conductive component 57 can be rationalized.

As described above, in the integral-type electric power steering device according to Embodiment 4 of the present invention, the device is configured as a coaxial type in which the motor component 40 is arranged between the reduction mechanism 20 and the control device 50, and the heat generated by the heating elements 531 is radiated to the motor-side case 520 via the thermal-conductive component 57, so that the radiation effect of the heating elements 531 can be improved.

Embodiment 5

Figure 6:
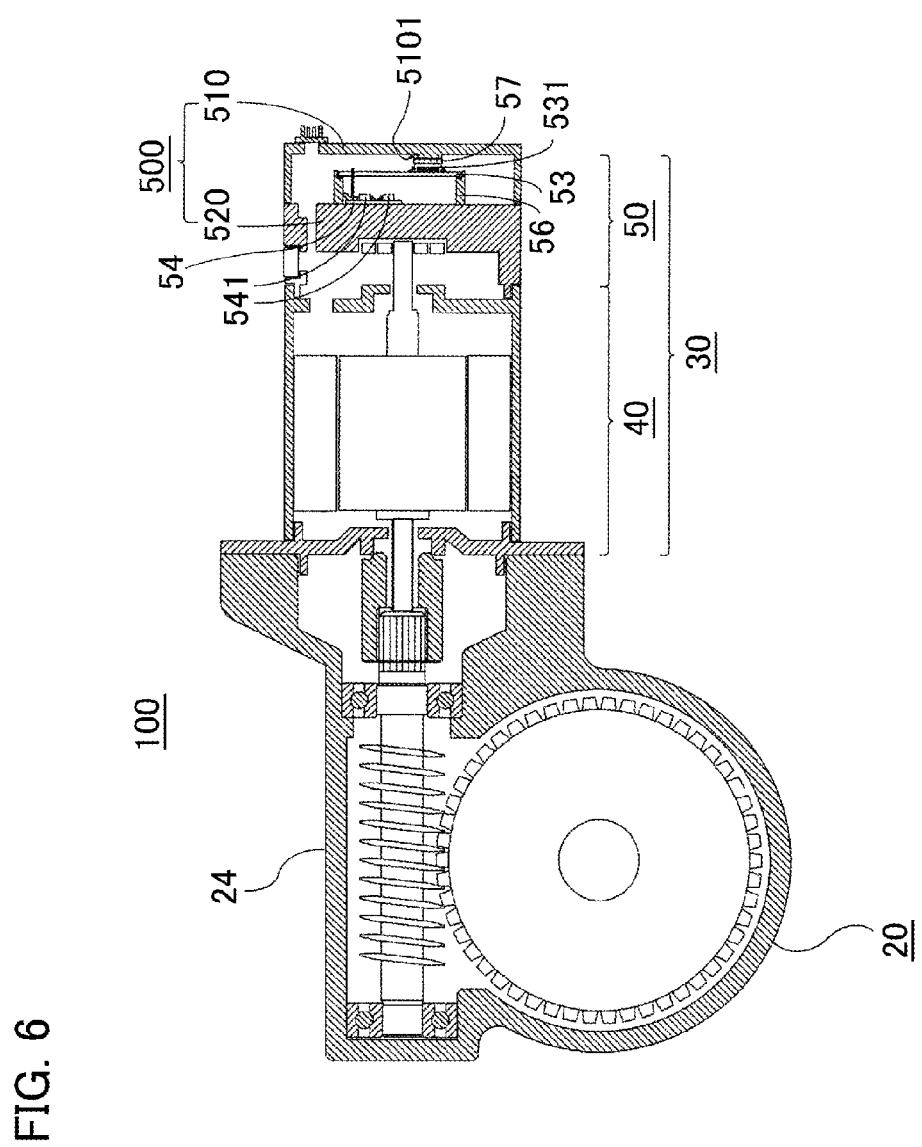
FIG. 6 is a cross-sectional view illustrating an integral-type electric power steering device according to Embodiment 5 of the present invention.

FIG. 6 is a cross-sectional view illustrating an integral-type electric power steering device according to Embodiment 5 of the present invention, and a coaxial-integral-type electric power steering device, in which a motor component 40 is arranged between a reduction mechanism 20 and a control device 50, is indicated. In other words, as illustrated in FIG. 6, the control device 50 is coaxially arranged with the motor component 40 at a side, being opposite to the reduction mechanism 20, of the motor component 40.

Heating elements 531 are mounted on a surface of the control board 53, which is faced to a motor-side case 520 of the control device (ECU) side. A thermal-conductive component 57 is arranged between surfaces of the heating elements 531 and a surface of a convex portion 5101 which is formed on a motor-opposite-side case 510 in mechanism components 500.

The heat generated by the heating elements 531 is radiated to the motor-opposite-side case 510 of the control device 50 via the thermal-conductive component 57, so that the heat is radiated to a side at which the heating elements 531 is not provided, and the radiation effect is improved.

As described above, the device is configured in such a way that the heat generated by the heating elements 531 is radiated to the motor-opposite-side case 510 of the control device 50 via the thermal-conductive component 57, and moreover, the heating elements 531, which generate the greatest amount of heat, and the power board 54 composing a power circuit are arranged in the motor-side case 520 of the control device 50, and the generated heat is radiated to the motor component 40 having a large heat mass, which radiates a heat to the reduction mechanism (gear) 20, whereby heat generated by the semiconductor elements 531, which is mounted on the control board 53, and the heat generated by the power board 54 are respectively radiated via passages which are extended in reverse directions each other, and the heat can be effectively radiated without interfering, and the device can be cooled.

Moreover, in the integral-type electric power steering device according to Embodiment 5 of the present invention, the curable resin is used for the thermal-conductive component 57, whereby the adhering process for the heating elements 531 of the thermal-conductive component 57 can be rationalized.

As described above, in the integral-type electric power steering device according to Embodiment 4 of the present invention, the device is configured as a coaxial type in which the motor component 40 is arranged between the reduction mechanism 20 and the control device 50, in other words, the device is configured as a coaxial type in which the control device 50 is arranged at an end portion in an axis direction of the motor component 40 at the reduction mechanism-opposite-side 20, and the heat generated by the heating elements 531 is radiated to the motor-opposite-side case 510, which has not a heating element, via the thermal-conductive component 57, whereby the radiation effect can be improved.

Moreover, in the integral-type electric power steering device according to Embodiment 5 of the present invention, the device is configured as a coaxial type in which the motor component 40 is arranged between the reduction mechanism 20 and the control device 50, and the device is configured as a coaxial type in which the control device 50 is arranged at an end portion in an axis direction of the motor component 40 at the reduction mechanism-opposite-side 20, and the heat generated by the heating elements 531 is radiated to the motor-opposite-side case 510, which has not a heating element, via the thermal-conductive component 57, and furthermore, the semiconductor elements 531 generating the highest heat and the power board 54, on which a power circuit is mounted, are arranged in the motor-side case 520, and the heat, which is generated by the power board 54, is radiated to the motor-side case 520, so that the device is configured in such a way that the heat generated by the power board 54 and the heat generated by the semiconductor elements 531 are respectively radiated via passages which are extended in reverse directions each other, whereby the heat can be effectively radiated without interfering, and the device can be cooled.

Embodiment 6

Hereinafter, an integral-type electric power steering device according to Embodiment 6 of the present invention will be explained. In Embodiment 6, the thermal-conductive component 57, which is described in Embodiment 1 through Embodiment 5, is formed in a sheet shape. The other configurations are the same as those described in any one of claims 1 through 5.

The thermal-conductive component 57 is formed in a sheet shape by using a material having flexibility, rebound resilience, and small adhesive property, whereby the thermal-conductive component 57 can be easily mounted by an adhering work in an assembling process. Moreover, when the component is assembled, heating elements 531 and a control board. 53 are pressed toward mechanism components 500 by the flexibility of the sheet, whereby the stress caused by the heating elements 531 and the control board 53 can be reduced.

Moreover, there is a case in which distances between the heating elements 531 or the control board 53 and the mechanism components 500 are varied in accordance with a thermal expansion/constriction of the mechanism components 500, which is caused in accordance with a temperature variation. However, when the thermal-conductive component. 57 is formed as a sheet-shaped component having flexibility, rebound resilience, and small adhesive property, the stress, which is caused in accordance with the variation of the distances, can be absorbed and reduced by varying the thickness of the thermal-conductive component 57. Therefore, the repeated stress, which is caused when the temperature variation is repeated, can be deleted.

As described above, in the integral-type electric power steering device according to Embodiment 6 of the present invention, the thermal-conductive component 57 is formed as the sheet-shaped component having flexibility, rebound resilience, and small adhesive property, so that the assembling process is easily performed, and the stress, which is caused when the heating elements 531 and the control board are pressed toward the mechanism components 500, can be reduced when the components are assembled. Moreover, the stress, which is caused by the thermal vibration and is applied to the lead wires and the soldered portion of the heating elements 531, the board, and the soldered portion of the board, can be deleted, whereby useful lives of the solder and the components can be increased, and the reliability of the device can be improved.

In addition, it is possible in the scope of the present invention that each of the embodiments is freely combined, or each of embodiments is suitably modified or omitted.

INDUSTRIAL APPLICABILITY

The integral-type electric power steering device of the present invention can be applied to a device in a car field, and particularly to an electric power steering device of a car.

What is claimed is:

1. An integral-type electric power steering device comprising:
    a motor component including a motor that generates an assist torque corresponding to a steering torque caused by a driver in a car and applies the generated assist torque to a steering shaft of the car via a reduction mechanism; and
    a control device which controls the motor, wherein:
    the control device comprises at least heating elements, which are operated for control and generate heat, a control board on which the heating elements are mounted, and a mechanism component to which the control board is fixed,
    at least a part of the heat, which is generated by the heating elements, is conducted to the mechanism component via a thermal-conductive component,
    wherein the mechanism component comprises a first part, which is a reduction-mechanism-side case for the reduction mechanism, and a second part, which is a motor-side case for the motor component,
    wherein at least one of the first part and the second part abuts the thermal-conductive component forming a thermal conductive passage between the heating elements and the mechanism component, and
    wherein the thermal-conductive component is arranged at a position corresponding to a location of the heating elements and is substantially smaller than the control board.

2. An integral-type electric power steering device as recited in claim 1, wherein the motor component and the control device are being integrally fixed to each other in a longitudinal direction of the rotor shaft of the motor on a same axis.

3. An integral-type electric power steering device as recited in claim 2, wherein a wall surface of the reduction-mechanism-side case and a wall surface of the motor-side case are arranged in a vertical direction with respect to the longitudinal direction of the rotor shaft.

4. An integral-type electric power steering device as recited in claim 1, wherein the motor component is arranged between the reduction mechanism and the control device, and
    the mechanism components include a motor-side case, which is connected to the motor component, and a motor-opposite-side case, and the control board is fixed to the motor-side case, and the heating elements are mounted on a surface of the control board, which faces to a wall surface of the motor-side case, and the thermal-conductive component is arranged between the heating elements and the wall surface of the motor-side case.

5. An integral-type electric power steering device as recited in claim 4, wherein the motor-side case includes a convex portion, which is contacted to the thermal-conductive component, on the wall surface.

6. An integral-type electric power steering device as recited in claim 4, wherein the control device further comprises a power-circuit element, which control power supplied to the motor, and a power board on which at least the power-circuit element is mounted, and the power board is contacted to the motor-side case so as to be mounted.

7. An integral-type electric power steering device as recited in claim 4, wherein a control-device-integrated motor is configured in such a way that the motor component and the control device are integrally fixed to a rotor shaft of the motor in a direction where the rotor shaft is extended.

8. An integral-type electric power steering device as recited in claim 1, wherein the motor component is arranged between the reduction mechanism and the control device, and the mechanism components include a motor-side case, which is connected to the motor component, and a motor-opposite-side case, and the control board is fixed to the motor-side case, and the heating elements are mounted on a surface of the control board, which faces to a wall surface of the motor-opposite-side case, and the thermal-conductive component is arranged between the heating elements and the wall surface of the motor-opposite-side case.

9. An integral-type electric power steering device as recited in claim 8, wherein the motor-side case includes a convex portion, which is contacted to the thermal-conductive component, on the wall surface.

10. An integral-type electric power steering device as recited in claim 9, wherein the wall surface of the reduction-mechanism-side case and the wall surface of the motor-opposite-side case are arranged in a vertical direction with respect to the direction where the rotor shaft is extended.

11. An integral-type electric power steering device as recited in claim 1, wherein the thermal-conductive component is formed in a sheet shape.

12. An integral-type electric power steering device as recited in claim 1, wherein the thermal-conductive component is made from a thermal-curable resin.

13. An integral-type electric power steering device as recited in claim 1, wherein the reduction-mechanism-side case comprises a convex portion, which contacts with the thermal-conductive component.

14. An integral-type electric power steering device as recited in claim 1, wherein the thermal-conductive component is approximately same size as a respective one of the heating elements and is arranged directly parallel to the respective one of the heating elements.

15. An integral-type electric power steering device as recited in claim 1, wherein the thermal-conductive component is dedicated to one of the heating elements.

16. An integral-type electric power steering device comprising:
a motor component including a motor that generates an assist torque corresponding to a steering torque caused by a driver in a car and applies the generated assist torque to a steering shaft of the car via a reduction mechanism; and
a control device which controls the motor, wherein:
the control device comprises at least heating elements, which are operated for control and generate heat, a control board on which the heating elements are mounted, and a mechanism component to which the control board is fixed,
at least a part of the heat, which is generated by the heating elements, is conducted to the mechanism component via a thermal-conductive component, and
wherein the control device is arranged between the reduction mechanism and the motor component, and the mechanism component comprises a reduction-mechanism-side case, which is connected to the reduction mechanism, and a motor-side case, which is connected to the motor component, and the control board is fixed to the reduction-mechanism-side case, and the heating elements are mounted on a surface of the control board which faces a wall surface of the motor-side case, and the thermal-conductive component is arranged between the heating elements and the wall surface of the motor-side case.

17. An integral-type electric power steering device as recited in claim 16, wherein the control device further comprises a power-circuit element, which control power supplied to the motor, and a power board on which at least the power-circuit element is mounted, and the power board is contacted to the reduction-mechanism-side case so as to be mounted.

18. An integral-type electric power steering device comprising:
a motor component including a motor that generates an assist torque corresponding to a steering torque caused by a driver in a car and applies the generated assist torque to a steering shaft of the car via a reduction mechanism; and
a control device which controls the motor, wherein:
the control device comprises at least heating elements, which are operated for control and generate heat, a control board on which the heating elements are mounted, and a mechanism component to which the control board is fixed,
at least a part of the heat, which is generated by the heating elements, is conducted to the mechanism component via a thermal-conductive component, and
wherein the control device is arranged between the reduction mechanism and the motor component, and the mechanism component comprises a reduction-mechanism-side case, which is connected to the reduction mechanism, and a motor-side case, which is connected to the motor component, and the control board is fixed to the reduction-mechanism-side case, and the heating elements are mounted on a surface of the control board which faces a wall surface of the reduction-mechanism-side case, and the thermal-conductive component is arranged between the control board and the wall surface of the motor-side case, and is arranged at a position corresponding to the mounted heating elements.

19. An integral-type electric power steering device as recited in claim 18, wherein the motor-side case includes a convex portion, which is contacted to the thermal-conductive component, on the wall surface.

20. An integral-type electric power steering device as recited in claim 19, wherein the reduction-mechanism-side case is positioned on a surface of the convex portion, which contacts the thermal-conductive component.

21. An integral-type electric power steering device as recited in claim 20, wherein the thermal-conductive component, which is made from a thermal-curable resin, is installed in the control device in a state where the resin is not stiffened, and then, the resin is stiffened.

22. An integral-type electric power steering device, comprising:
a motor component including a motor that generates an assist torque corresponding to a steering torque caused by a driver in a car and applies the generated assist torque to a steering shaft of the car via a reduction mechanism; and
a control device which controls the motor, wherein:
the control device comprises at least heating elements, which are operated for control and generate heat, a control board on which the heating elements are mounted, and a mechanism component to which the control board is fixed,
at least a part of the heat, which is generated by the heating elements, is conducted to the mechanism component via a thermal-conductive component,
the mechanism component comprises a first part, which is a reduction-mechanism-side case for the reduction mechanism, and a second part, which is a motor-side case for the motor component,
the control device is arranged between the reduction mechanism and the motor component,
the reduction-mechanism-side case is connected to the reduction mechanism and the motor-side case is connected to the motor component,
the control board is fixed to the reduction-mechanism-side case,
the heating elements are mounted on a surface of the control board which faces a wall surface of the reduction-mechanism-side case, and
the thermal-conductive component is arranged between the heating elements and the wall surface of the reduction-mechanism-side case.

23. An integral-type electric power steering device as recited in claim 22, wherein the reduction-mechanism-side case includes a convex portion, which is contacted to the thermal-conductive component, on the wall surface.

* * * * *